US012800858B2

(12) United States Patent
Cheng

(10) Patent No.: US 12,800,858 B2
(45) Date of Patent: Nov. 17, 2026

(54) OPTICAL COUPLING STRUCTURE AND METHOD FOR MANUFACTURING THE SAME, AND OPTICAL COMMUNICATION SYSTEM

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 282 days.

(21) Appl. No.: 18/630,945

(22) Filed: Apr. 9, 2024

(65) Prior Publication Data

US 2025/0116831 A1 Apr. 10, 2025

(30) Foreign Application Priority Data

Oct. 7, 2023 (CN) ......................... 202311284253.1

(51) Int. Cl.
*G02B 6/43* (2006.01)
*G02B 6/42* (2006.01)
*H10H 29/10* (2025.01)
*H04B 10/25* (2013.01)

(52) U.S. Cl.
CPC ............... *G02B 6/43* (2013.01); *G02B 6/424* (2013.01); *H10H 29/10* (2025.01); *H04B 10/25891* (2020.05)

(58) Field of Classification Search
CPC ...... G02B 6/4214; G02B 6/423; G02B 6/424; G02B 6/3644; G02B 6/3652; H10H 29/10
See application file for complete search history.

(56) References Cited

U.S. PATENT DOCUMENTS

2013/0301982 A1* 11/2013 Lee .................... G02B 6/12019 29/829

* cited by examiner

*Primary Examiner* — Michael P Mooney
(74) *Attorney, Agent, or Firm* — Westbridge IP LLC

(57) ABSTRACT

An optical coupling structure includes a growth substrate and an optical functional layer. A first hole and a second hole are connected in series along a thickness direction of the growth substrate and are used for connecting an optical fiber including an optical fiber core and a coating layer wrapping the optical fiber core, and the coating layer is accommodated in the second hole, so that alignment and fixation between the optical fiber and the growth substrate are realized, improving overall stability of the optical coupling structure; and an end portion of the optical fiber core is accommodated in the first hole, so that a distance between the end portion and the optical functional layer is reduced, and the end portion is used to couple an optical signal from the optical functional layer, so that a coupling efficiency between the optical signal and the optical fiber may be improved.

19 Claims, 7 Drawing Sheets

OPTICAL COUPLING STRUCTURE AND METHOD FOR MANUFACTURING THE SAME, AND OPTICAL COMMUNICATION SYSTEM

CROSS-REFERENCE TO RELATED APPLICATIONS

The present application claims priority to Chinese Patent Application 202311284253.1, filed on Oct. 7, 2023, the content of which is incorporated herein by reference in its entirety.

TECHNICAL FIELD

The present application relates to the field of optical communication technologies, and in particular, to an optical coupling structure and a method for manufacturing the same, and an optical communication system.

BACKGROUND

Active optical cables (AOCs) are commonly used as signal transmission equipment, which are generally used for high-speed and high-reliability interconnection among equipment such as a data center, a high-performance computer or a large-capacity memory, and are usually composed of an integrated photoelectric device and an optical fiber. A light source used in the AOCs is generally a semiconductor laser, such as a vertical cavity surface emitting laser (VCSEL) or a distributed feedback (DFB) laser that is edge emitted. The semiconductor laser needs to operate above its threshold current to function properly, which requires a relatively high power consumption, and has a reliability risk under a high-temperature condition. In contrast, when a Micro LED is used as a light source, the Micro LED can emit light under spontaneous radiation, is small in size and low in power consumption, and can have a longer life under a high-temperature condition.

At present, there are no mature schemes for coupling a Micro LED array to an optical fiber in the industry. Therefore, it is necessary to seek an optical coupling structure to improve a coupling efficiency between an optical signal and the optical fiber.

SUMMARY

In view of this, embodiments of the present application provide an optical coupling structure and a method for manufacturing the same, and an optical communication system, so as to solve technical problems in the related technologies of a relatively low coupling efficiency between an optical signal and an optical fiber.

According to an aspect, an embodiment of the present application provides an optical coupling structure, including: a growth substrate and at least one optical functional layer. At least one first hole and a second hole are connected in series along a thickness direction of the growth substrate, the at least one first hole and the second hole penetrate through the growth substrate, and an aperture of each of the at least one first hole is less than an aperture of the second hole; and the at least one optical functional layer is located on a side, close to the at least one first hole, of the growth substrate. The at least one first hole is used to accommodate at least one end portion of at least one optical fiber core, respectively, the second hole is used to accommodate an end portion of a coating layer wrapping the at least one optical fiber core, and the at least one end portion of the at least one optical fiber core protrudes axially beyond the coating layer.

According to another aspect, an embodiment of the present application provides a method for manufacturing an optical coupling structure, including: providing a growth substrate, and epitaxially forming at least one optical functional layer on a side of the growth substrate; etching the growth substrate from the other side of the growth substrate and corresponding to a position of each of the at least one optical functional layer, to sequentially form a second hole and at least one first hole that are penetrating through the growth substrate, so that the at least one optical functional layer is located on a side, close to the at least one first hole, of the growth substrate, and an aperture of each of the at least one first hole being less than an aperture of the second hole.

According to another aspect, an embodiment of the present application provides an optical communication system, including a transmitting apparatus, a receiving apparatus and an optical fiber. The transmitting apparatus has a transmitting end which includes a first optical coupling structure; the receiving apparatus has a receiving end which includes a second optical coupling structure; two ends of the optical fiber are respectively connected to the first optical coupling structure and the second optical coupling structure to transmit an optical signal between the transmitting apparatus and the receiving apparatus, and the optical fiber includes at least one optical fiber core and a coating layer wrapping the at least one optical fiber core; and the first optical coupling structure and the second optical coupling structure each include a growth substrate and at least one optical functional layer. At least one first hole and a second hole are connected in series along a thickness direction of the growth substrate, the at least one first hole and the second hole penetrate through the growth substrate, and an aperture of each of the at least one first hole is less than an aperture of the second hole; and the at least one optical functional layer is located on a side, close to the at least one first hole, of the growth substrate. In the first optical coupling structure, at least one first end portion of the at least one optical fiber core protrudes axially beyond the coating layer and is correspondingly accommodated in the at least one first hole, and the coating layer is correspondingly accommodated in the second hole, and/or in the second optical coupling structure, at least one second end portion of the at least one optical fiber core protrudes axially beyond the coating layer and is correspondingly accommodated in the at least one first hole, and the coating layer is correspondingly accommodated in the second hole.

DETAILED DESCRIPTIONS OF THE EMBODIMENTS

Technical solutions in the embodiments of the present application are clearly and completely described below with reference to the accompanying drawings in the embodiments of the present application. Apparently, the described embodiments are a part of the embodiments of the present application, rather than all the embodiments.

In order to solve the above problems, embodiments of the present application provide an optical coupling structure, including: a growth substrate and an optical functional layer. A first hole and a second hole are connected in series along a thickness direction of the growth substrate, the first hole and the second hole penetrate through the growth substrate, and an aperture of the first hole is less than an aperture of the second hole; the optical functional layer is located on a side, close to the first hole, of the growth substrate; and the first hole and the second hole are used for connecting an optical fiber. The optical fiber includes an optical fiber core and a coating layer wrapping the optical fiber core, and an end portion of the optical fiber core protrudes axially beyond the coating layer. The first hole is used to accommodate the end portion of the optical fiber core, so that a distance between the end portion of the optical fiber core and the optical functional layer is relatively small. When the optical functional layer is a light emitting epitaxial layer, the end portion of the optical fiber core is used to couple an optical signal from the light emitting epitaxial layer. The second hole is used to accommodate the coating layer. In this way, when a Micro LED is used as a light source, although a divergence angle of the Micro LED is greater than that of a semiconductor laser, a distance between the end portion of the optical fiber core and the light emitting epitaxial layer is relatively small, so that light can emit into the end portion of the optical fiber core before the light excessively diverges, improving a coupling efficiency between an optical signal and the optical fiber.

Figure 1A:
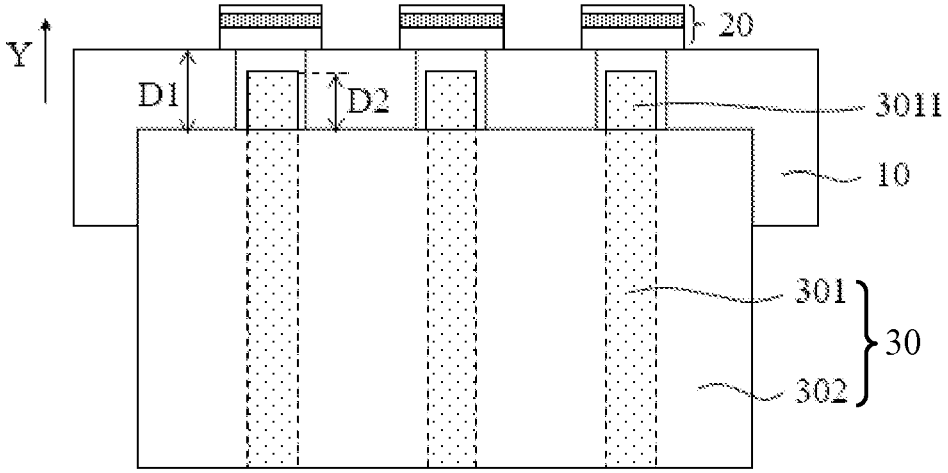
FIG. 1*a* is a schematic diagram of an optical coupling structure according to an embodiment of the present application.

FIG. 1*a* is a schematic diagram of an optical coupling structure according to an embodiment of the present application. FIG. 2 to FIG. 7 are schematic diagrams of intermediate structures generated during a process of manufacturing the optical coupling structure shown in FIG. 1*a*. As shown in FIG. 1*a*, and FIG. 2 to FIG. 7, an optical coupling structure 100 according to an embodiment of the present application includes a growth substrate 10, an optical fiber 30, and an optical functional layer 20. The optical functional layer in this embodiment is a light emitting functional layer, which is specifically a light emitting epitaxial layer for generating an optical signal. Along a thickness direction Y of the growth substrate 10, the growth substrate 10 is provided with a plurality of first holes 101 and a second hole 102, and the plurality of first holes 101 and the second hole 102 are connected in series to penetrate through the growth substrate 10. An aperture R1 of the first hole 101 is less than an aperture R2 of the second hole 102; the optical functional layer 20 is located on a side, close to the first hole 101, of the growth substrate 10; and the optical fiber 30 includes an optical fiber core 301 and a coating layer 302 wrapping the optical fiber core 301, an end portion 3011 of the optical fiber core 301 is obtained by removing the coating layer 302 from the optical fiber 30, the end portion 3011 is correspondingly accommodated in the first hole 101 and is used for coupling an optical signal from the optical functional layer 20, and the coating layer 302 is correspondingly accommodated in the second hole 102.

Specifically, the first hole 101 and the second hole 102 are distributed along the thickness direction of the growth substrate 10, for example, the first hole 101 is closer to the optical functional layer 20, and the second hole 102 is located on a side, away from the optical functional layer 20, of the growth substrate 10. The end portion 3011 in the first hole 101 is used for coupling the optical signal from the optical functional layer 20. The first hole 101 and the second hole 102 are connected to form a through hole penetrating through the growth substrate 10. In other words, the through hole has a multi-level aperture. The second hole 102 having a relatively large aperture is used to accommodate the coating layer 302 of the optical fiber 30 to realize alignment and fixation between the optical fiber 30 and the growth substrate 10. The first hole 101 having a relatively small aperture is used to accommodate the end portion 3011 of the optical fiber core 301, i.e., the optical fiber core 301 extends into the first hole 101, so that a distance between the end portion 3011 of the optical fiber core 301 and the optical functional layer 20 is reduced, i.e., a path distance of the optical signal from the optical functional layer 20 to the end portion 3011 of the optical fiber core 301 is reduced, reducing a divergence of the optical signal, and further improving a coupling efficiency of the optical signal.

It may be understood that the end portion 3011 of the optical fiber core 301 extends into the first hole 101, and therefore, on a plane where the growth substrate 10 is located, a projection of the first hole 101 falls within a projection of the second hole 102.

The above-mentioned optical coupling structure 100 may be used as a transmitting end in a signal transmission apparatus, an optical signal is generated through the light emitting epitaxial layer, and then is transmitted to a receiving end through the optical fiber 30. In other embodiments, the optical functional layer may also be a photosensitive functional layer, which may specifically be a semiconductor photodiode. The photodiode may be used to convert an optical signal into an electrical signal, and an optical coupling structure having such an optical functional layer may be used as the receiving end in the signal transmission apparatus.

Figure 1B:
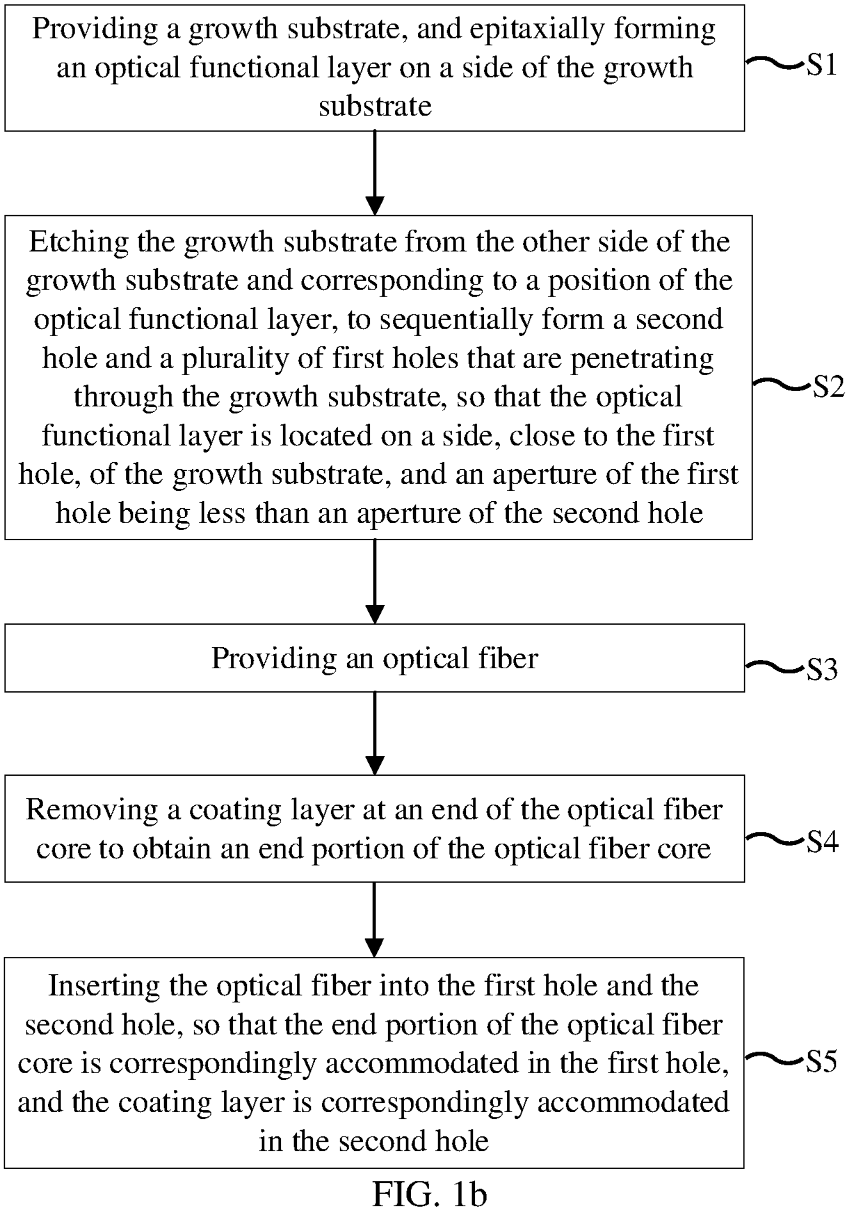
FIG. 1*b* is a flowchart of a method for manufacturing the optical coupling structure shown in FIG. 1 according to an embodiment of the present application.

FIG. 1*b* is a flowchart of a method for manufacturing the optical coupling structure shown in FIG. 1 according to an embodiment of the present application, as shown in FIG. 1*b*, the method includes the following steps.

Figure 2:
FIG. 2 to FIG. 7 are schematic diagrams of intermediate structures generated during a process of manufacturing the optical coupling structure shown in FIG. 1.
Figure 3:
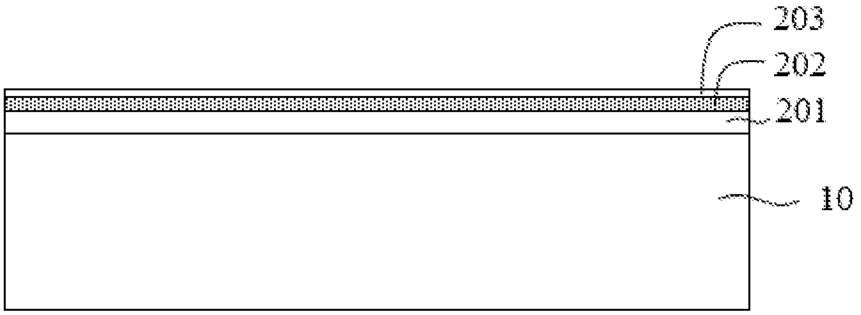
Figure 4:
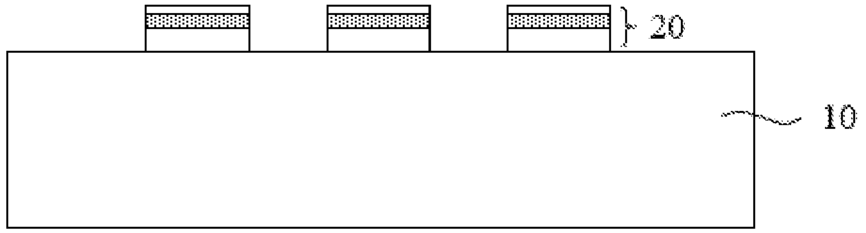

In step S1, as shown in FIG. 2 to FIG. 4, providing a growth substrate 10, and epitaxially forming an optical functional layer 20 on a side of the growth substrate 10. Specifically, as shown in FIGS. 2 to 4, an N-type semiconductor layer 201 with a whole layer, an active light emitting layer 202 with a whole layer, and a P-type semiconductor layer 203 with a whole layer are first epitaxially formed on the growth substrate 10, and then is patterned and etched to form the optical functional layer 20. Optionally, a mask layer exposing the growth substrate 10 is first formed on the growth substrate 10, and then the optical functional layer 20 is selectively epitaxially formed in an opening of the mask layer.

In one embodiment, a material of the growth substrate 10 is any one of Si, SiGe, SiC, sapphire, or a group III-V semiconductor material. Optionally, taking a GaN-based material as an example, the material of the growth substrate 10 is any one of Si, SiGe, SiC sapphire or GaN, so that a crystal structure of the optical functional layer 20 at the later stage may be improved. When Si is used, the first hole 101 is composed of an opaque sidewall made of Si, which is benefit to limit an optical signal being coupled to the end portion 3011 of the optical fiber core 301.

In one embodiment, a material of the optical functional layer 20 is a group III-V semiconductor material. Specifically, as shown in FIG. 2, the optical functional layer 20 includes the N-type semiconductor layer 201, the active light emitting layer 202, and the P-type semiconductor layer 203 sequentially epitaxially formed on the growth substrate 10.

Optionally, materials of the N-type semiconductor layer 201 and the P-type semiconductor layer 203 are GaN, and a material of the active light emitting layer 202 is a non-limiting combination of GaN, InGaN, AlGaN or InAlGaN; specifically, visible light is emitted from the active light emitting layer 202, and the optical coupling structure is used for coupling the visible light. Optionally, the materials of the N-type semiconductor layer 201 and the P-type semiconductor layer 203 are InP, and the material of the active light emitting layer 202 is a non-limiting combination of Inp, GalnP, AlInP or AlInGaP.

Optionally, before the N-type semiconductor layer 201 is epitaxially formed, a nucleation layer and a buffer layer (not shown) are formed in advance to alleviate a stress generated during the growth of the optical functional layer 20, improving the crystal structure of the optical functional layer 20; and taking a GaN-based material as an example, a material of the nucleation layer may be AlN, and a material of the buffer layer may be GaN.

Figure 5:
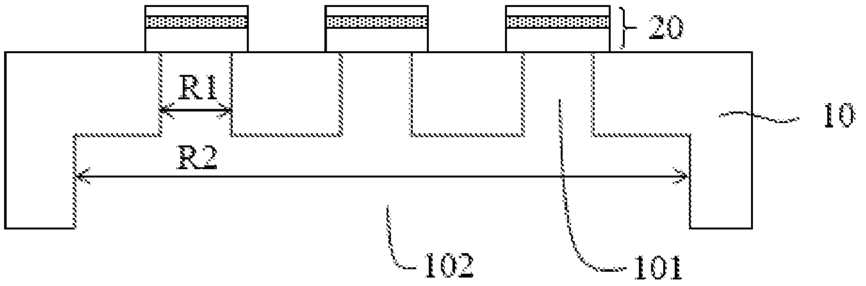

In step S2, as shown in FIG. 5, etching the growth substrate 10 from the other side of the growth substrate 10 and corresponding to a position of the optical functional layer 20, to sequentially form a second hole 102 and a plurality of first holes 101 that are penetrating through the growth substrate 10, so that the optical functional layer 20 is located on a side, close to the first hole 101, of the growth substrate 10, and an aperture R1 of the first hole 101 being less than an aperture R2 of the second hole 102. Specifically, the first hole 101 and the second hole 102 with different apertures are formed by using an overlay manner, a through hole penetrating through the growth substrate 10 is formed by the first hole 101 and the second hole 102, and the through hole has a multi-level aperture.

Figure 6:
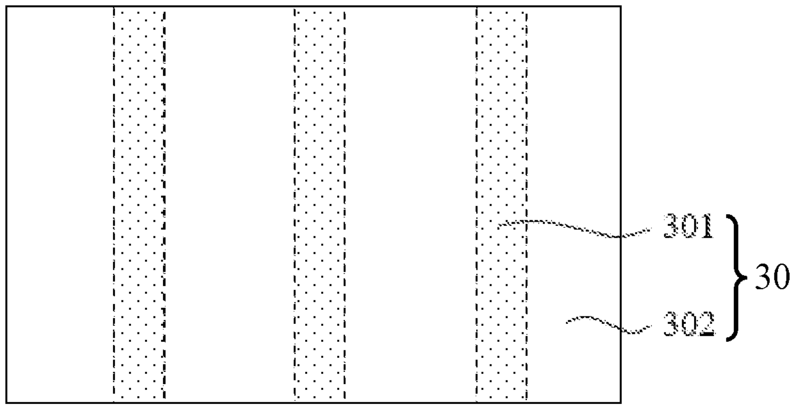

In step S3, as shown in FIG. 6, providing an optical fiber 30. The optical fiber 30 includes a plurality of optical fiber cores 301 and a coating layer 302 wrapping the plurality of optical fiber cores 301. Specifically, the optical fiber core 301 may be a glass fiber made of $SiO_2$ or the optical fiber core 301 may be made of Si, and the coating layer 302 may be another transparent material, such as Si or a resin material, which has a refractive index lower than that of the optical fiber core 301, so that an optical signal is limited to propagating in the optical fiber core 301, and structures such as an internal optical fiber core are protected. Optionally, the optical fiber 30 is a glass optical fiber or a plastic optical fiber.

Figure 7:
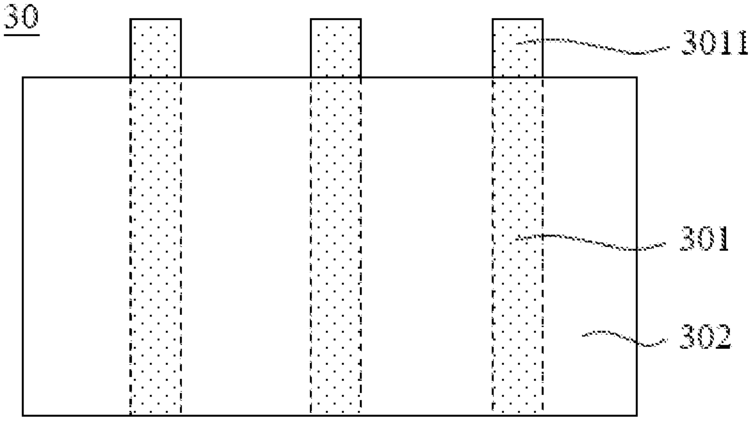

In step S4, as shown in FIG. 7, removing a coating layer 302 at an end of the optical fiber core 301 to obtain an end portion 3011 of the optical fiber core 301, forming the optical fiber 30. Specifically, a process of removing the coating layer 302 may be wet-etching. The end portion 3011 of the optical fiber core 301 may have a common structure with 8° angle or a structure with another optimized angle, so as to reduce reflection.

In step S5, as shown in FIG. 1*a*, inserting the optical fiber 30 into the first hole 101 and the second hole 102, so that the end portion 3011 of the optical fiber core 301 is correspondingly accommodated in the first hole 101, and the coating layer 302 is correspondingly accommodated in the second hole 102. Specifically, the second hole 102 having a relatively large aperture is used to accommodate the coating layer 302 of the optical fiber 30 to realize alignment and fixation between the optical fiber 30 and the growth substrate 10, and the first hole 101 having a relatively small aperture is used to accommodate the end portion 3011 of the optical fiber core 301, i.e., the optical fiber core 301 extends into the first hole 101, so as to couple an optical signal from the optical functional layer 20 and reduce a distance between the end portion 3011 of the optical fiber core 301 and the optical functional layer 20, improving a coupling efficiency of the optical signal.

In an embodiment, as shown in FIG. 5, the aperture R1 of the first hole 101 ranges from 5 μm to 20 μm; and/or the aperture R2 of the second hole 102 ranges from 100 μm to 10 mm. Specifically, the aperture of the first hole 101 matches a size of the optical functional layer 20, and the aperture of the first hole 101 may be slightly greater than, equal to or slightly less than the size of the optical functional layer 20; and the aperture of the second hole 102 matches a size of the coating layer 302 of the optical fiber 30, and the aperture of the second hole 102 may be slightly greater than or equal to the size of the coating layer 302.

In one embodiment, as shown in FIG. 1*a* and FIG. 5, along a thickness direction Y of the growth substrate 10, a depth D1 of the first hole 101 is greater than a length D2 of the end portion 3011 of the optical fiber core 301. It may be understood that, the end portion 3011 is not directly in contact with the optical functional layer 20, and when the growth substrate 10 and the optical fiber 30 are assembled, a gap is reserved, preventing the optical functional layer 20 from being damaged due to contact between the optical functional layer 20 and the end portion 3011.

Figure 8:
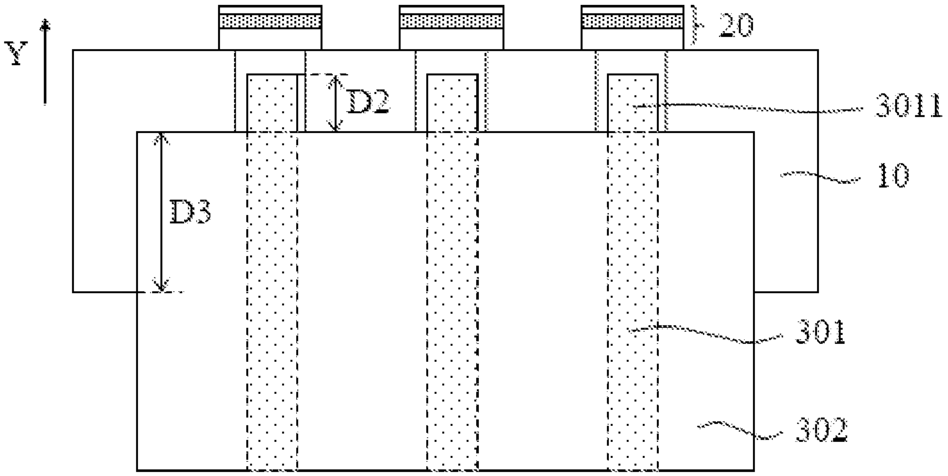
FIG. 8 is a schematic diagram of another optical coupling structure according to an embodiment of the present application.

In one embodiment, FIG. 8 is a schematic diagram of another optical coupling structure according to an embodiment of the present application. As shown in FIG. 5 and FIG. 8, along a thickness direction Y of the growth substrate 10, a depth D3 of the second hole 102 is greater than a length D2 of the end portion 3011 of the optical fiber core 301. In this way, when the growth substrate 10 and the optical fiber 30 are assembled, the coating layer 302 extends into the second hole 102 before the end portion 3011 extends into the first hole 101, and there is a shaft hole matching structure between the coating layer 302 and the second hole 102, so that the end portion 3011 is pre-aligned with the first hole 101. Specifically, since the depth D3 of the second hole 102 is greater than the length D2 of the end portion 3011 of the optical fiber core 301, when the coating layer 302 just enters the second hole 102, a distance "D3–D2" is reserved between the end portion 3011 and the first hole 101, so that the end portion 3011 does not contact a bottom of the second hole 102 before being aligned with the first hole 101. In this way, the end portion 3011 may safely and accurately extend into the first hole 101. Since the optical fiber core 301 is brittle and easy to damage, through such a configuration, the end portion 3011 of the optical fiber core 301 may be prevented from being damaged during an entire assembly process, and an assembly difficulty of the optical coupling structure is reduced. On the other hand, the growth substrate 10 retains a relatively thick thickness, which may simplify a process of thinning a substrate.

Optionally, in order to ensure stability of the optical coupling structure, a thickness of the growth substrate 10 is greater than 100 μm.

In some embodiments, steps S1 to S2 and steps S3 to S5 may be performed by different manufacturers. For example, a manufacturer I may manufacture an optical coupling structure that does not include an optical fiber through steps S1 and S2, and sell the optical coupling structure to a manufacturer II. After receiving the optical coupling structure, the manufacturer II further performs steps S3 to S5 to install the optical fiber into the optical coupling structure.

Figure 9:
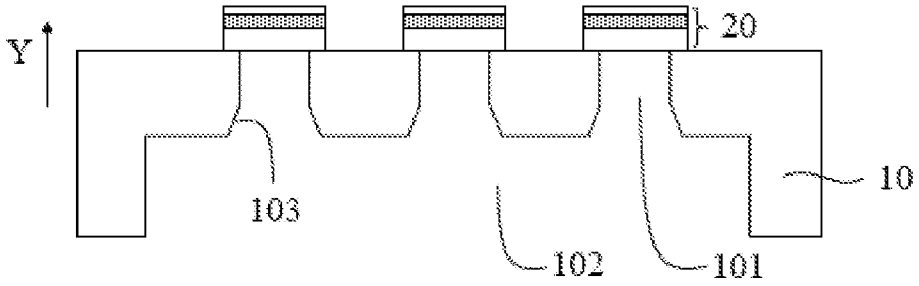
FIG. 9 is a schematic diagram of another growth substrate according to an embodiment of the present application.

FIG. 9 is a schematic diagram of another growth substrate according to an embodiment of the present application. As shown in FIG. 9, in this embodiment, an inclined plane (chamfer) 103 is provided on a side, close to the second hole 102, of the first hole 101. It may be understood that the presence of the inclined plane 103 expands an aperture of a side, close to the second hole 102, of the first hole 101, which may guide the end portion 3011 of the optical fiber core 301 to extend into the first hole 101, reducing a difficulty of assembling the optical coupling structure.

In one embodiment, as shown in FIG. 7, each optical fiber 30 includes at least one optical fiber core 301, and a number of the optical functional layers 20 is the same as a number of the optical fiber cores 301. Specifically, the number of the optical functional layers 20 is consistent with the number of the optical fiber cores 301, and an optical signal emitted from each optical functional layer 20 is coupled to a corresponding optical fiber core 301.

In one embodiment, as shown in FIG. 7, the optical fiber 30 is a multi-core optical fiber, the multi-core optical fiber includes N optical fiber cores 301, a number of the optical functional layers 20 is N, and N is an integer greater than or equal to 2. Specifically, in a cross section shown in FIG. 7, N is 3, one optical coupling structure includes three optical functional layers 20 and three optical fiber cores 301, and the number of the optical functional layers 20 and a number of the optical fiber cores 301 in one optical coupling structure are not limited in the present application.

Figure 10:
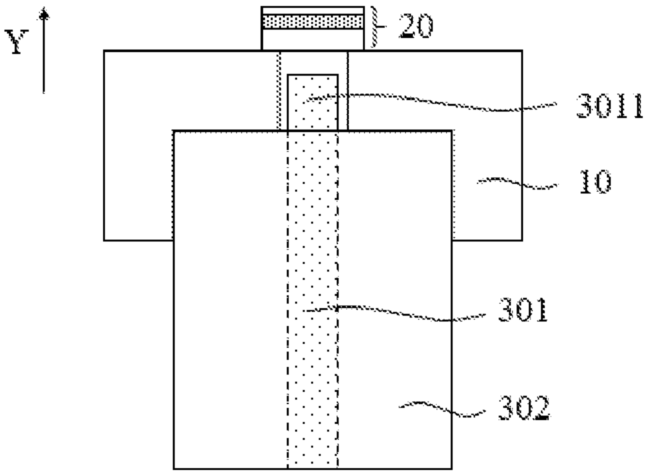
FIG. 10 is a schematic diagram of another optical coupling structure according to an embodiment of the present application.

Optionally, FIG. 10 is a schematic diagram of another optical coupling structure according to an embodiment of the present application. As shown in FIG. 10, one optical coupling structure includes one optical functional layer 20 and one optical fiber core 301. The growth substrate 10 includes the first hole for accommodating the end portion 3011 of the optical fiber core 301 and the second hole for accommodating the coating layer 302.

Figure 11:
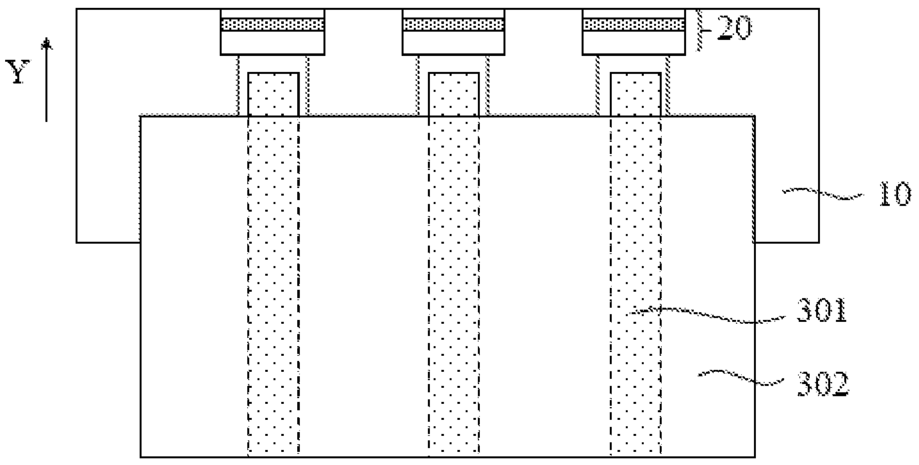
FIG. 11 is a schematic diagram of another optical coupling structure according to an embodiment of the present application.

Optionally, FIG. 11 is a schematic diagram of another optical coupling structure according to an embodiment of the present application, as shown in FIG. 11, the growth substrate 10 is a patterned substrate including a groove, and the optical functional layer 20 is epitaxially grown in the groove of the growth substrate 10. Optionally, a part of the optical functional layer 20 is epitaxially grown in the groove of the growth substrate 10.

Figure 12:
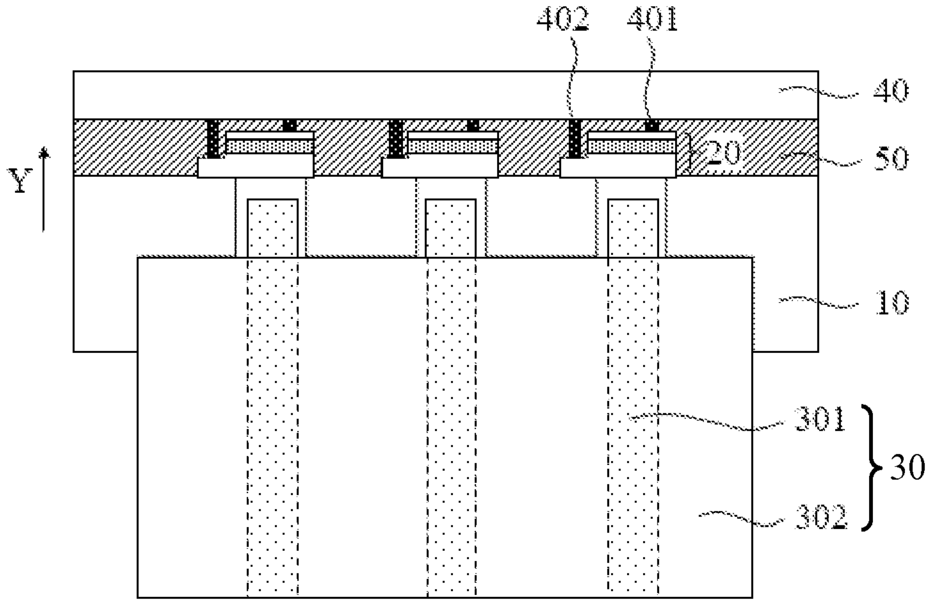
FIG. 12 is a schematic diagram of another optical coupling structure according to an embodiment of the present application.

Optionally, FIG. 12 is a schematic diagram of another optical coupling structure according to an embodiment of the present application, as shown in FIG. 12, the optical coupling structure further includes a driving substrate 40 located on a side, away from the optical fiber 30, of the optical functional layer 20. The optical functional layer 20 is provided with an electrical signal through electrodes 401/402 of the driving substrate 40. Optionally, a light-blocking material 50 is filled between the driving substrate 40 and the growth substrate 10, so that an optical signal from the optical functional layer 20 is emitted from a position close to the first hole 101.

Figure 13:
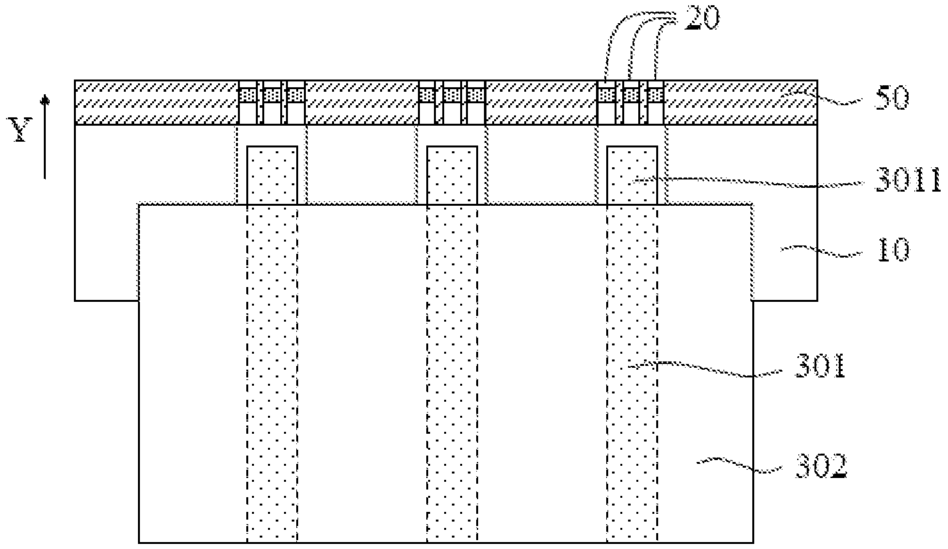
FIG. 13 is a schematic diagram of another optical coupling structure according to an embodiment of the present application.

Optionally, FIG. 13 is a schematic diagram of another optical coupling structure according to an embodiment of the present application, as shown in FIG. 13, the optical coupling structure includes a multi-core optical fiber, and the multi-core optical fiber includes a plurality of optical fiber cores 301 and a coating layer 302 wrapping the plurality of optical fiber cores 301. One optical fiber core 301 corresponds to a plurality of optical functional layers 20. Specifically, a light emitting array is formed by the plurality of optical functional layers 20 corresponding to the one optical fiber core 301, wavelengths of light emitting from the light emitting array are the same, and the optical fiber core 301 has a single-mode; or a light emitting array emitting light with different wavelengths is formed by the plurality of optical functional layers 20, and the optical fiber core 301 has a multi-mode. It should be noted that FIG. 13 illustrates that one light emitting array includes three optical functional layers 20, but a number of the optical functional layers 20 is not limited in the embodiment. Optionally, in order to maintain stability of the light emitting array, an insulating light-blocking material 50 may be filled between the optical functional layers 20.

Optionally, the optical coupling structure further includes an optical film. The optical film is located between the optical functional layer 20 and the end portion 3011 of the optical fiber core 301. A refractive index of the optical film is between a refractive index of a semiconductor film layer, close to the growth substrate, in the optical functional layer 20 and a refractive index of the end portion 3011. Specifically, the refractive indexes of the optical film, the semiconductor film layer and the end portion 3011 are gradual, so that the optical signal from the optical functional layer 20 is gradually bundled through the optical film, the semiconductor film layer and the end portion 3011 before entering the optical fiber 30, reducing a light loss, and further improving a coupling efficiency.

Optionally, the refractive index of the optical film is gradual. Optionally, taking the optical functional layer 20 made of a GaN-based material as an example, the semiconductor film layer on the side, close to the growth substrate 10, in the optical functional layer 20 is a nucleation layer made of AlN, a refractive index of AlN is 2.1, a material of the end portion 3011 of the optical fiber 30 is $SiO_2$, a refractive index of $SiO_2$ is 1.45, and the refractive index of the optical film is between 1.45 and 2.1. Optionally, a material of the optical film is SiON, and different refractive indexes are adjusted by controlling a nitrogen content or an oxygen content of SiON, so as to obtain an optical film with a specific refractive index or a gradient refractive index.

Figure 14:
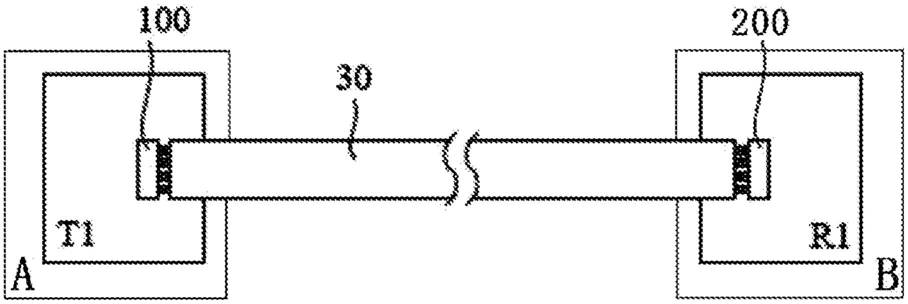
FIG. 14 is a schematic diagram of an optical communication system according to an embodiment of the present application.

An embodiment of the present application further provides an optical communication system, which includes the optical coupling structure in the foregoing embodiments. Specifically, FIG. 14 is a schematic diagram of an optical communication system according to an embodiment of the present application, as shown in FIG. 14, the optical communication system includes a transmitting apparatus A, a receiving apparatus B, and an optical fiber 30 connecting the transmitting apparatus A and the receiving apparatus B. The transmitting apparatus A includes a transmitting end T1, and the transmitting end T1 includes an optical coupling structure 100. The receiving device B includes a receiving end R1, and the receiving end R1 includes a second optical coupling structure 200. Information, in a form of light waves, are coupled to the optical fiber 30 by the optical coupling structure 100, and then propagate through the optical fiber 30, and finally are coupled to the receiving end R1. The first optical coupling structure 100 and the second optical coupling structure 200 may be the optical coupling structure described in any of the foregoing embodiments, and a difference lies in that the optical functional layer in the first optical coupling structure 100 is a light emitting functional layer, and the optical functional layer in the second optical coupling structure 200 is a photosensitive functional layer.

Embodiments of the present application provide an optical coupling structure and a method for manufacturing the same, and an optical communication system, the optical coupling structure includes a growth substrate, the growth substrate is etched along a thickness direction of the growth substrate to form a first hole and a second hole that are penetrating through the growth substrate, an optical functional layer is located on a side, close to the first hole, of the growth substrate, an optical fiber includes an optical fiber core and a coating layer wrapping the optical fiber core, and the coating layer is correspondingly accommodated in the second hole with a relatively large aperture, so that alignment and fixation between the optical fiber and the growth substrate are achieved, improving overall stability of the optical coupling structure; and an end portion of the optical fiber core is exposed outside of the coating layer and is correspondingly accommodated in the first hole with a relatively small aperture, so that a distance between the end portion of the optical fiber core and the optical functional layer is reduced, and the end portion of the optical fiber core is used for coupling an optical signal from the optical functional layer, so that a coupling efficiency of the optical signal may be improved.

Embodiments of the present application provide an optical coupling structure and a method for manufacturing the same, and an optical communication system. The optical coupling structure includes a growth substrate and at least one optical functional layer. At least one first hole and a second hole are connected in series along a thickness direction of the growth substrate, the at least one first hole and the second hole penetrate through the growth substrate, and an aperture of each of the at least one first hole is less than an aperture the second hole; the at least one optical functional layer is located on a side, close to the at least one first hole, of the growth substrate; and the at least one first hole is used to accommodate at least one end portion of at least one optical fiber core, respectively, the second hole is used to accommodate an end portion of a coating layer wrapping the at least one optical fiber core, and the at least one end portion of the at least one optical fiber core protrudes axially beyond the wrapping layer. The coating layer of an optical fiber is correspondingly accommodated in the second hole with a relatively large aperture, so that alignment and fixation between the optical fiber and the growth substrate are realized, improving overall stability of the optical coupling structure; and the end portion of the optical fiber core is exposed outside of the coating layer and is correspondingly accommodated in the first hole with a relatively small aperture, so that a distance between the end portion of the optical fiber core and the optical functional layer may be reduced. When the optical functional layer is a light emitting epitaxial layer, the end portion of the optical fiber core is used to couple an optical signal from the light emitting epitaxial layer. The distance between the end portion of the optical fiber core and the light emitting epitaxial layer is relatively small, so that light can emit into the end portion of the optical fiber core before the light excessively diverges, improving a coupling efficiency between the optical signal and the optical fiber.

It should be understood that the terms "include" and variations thereof used in the present application are open-ended, i.e., "including, but not limited to". The term "one embodiment" means "at least one embodiment". In the specification, the specific features, structures, materials, or characteristics described may be combined in any suitable manner in any one or more embodiments or examples. In addition, in the case of no contradiction, a person skilled in the art may combine and constitute different embodiments or examples, and the features in different embodiments or examples described in this specification.

What is claimed is:

1. An optical coupling structure, comprising:

a growth substrate having at least one first hole and a second hole connected in series along a thickness direction of the growth substrate, the at least one first hole and the second hole penetrating through the growth substrate, and an aperture of each of the at least one first hole being less than an aperture of the second hole; and at least one optical functional layer located on a side, close to the at least one first hole, of the growth substrate;

wherein the at least one first hole is used to accommodate at least one end portion of at least one optical fiber core, respectively, the second hole is used to accommodate an end portion of a coating layer wrapping the at least one optical fiber core, and the at least one end portion of the at least one optical fiber core protrudes axially beyond the coating layer; and the optical coupling structure further comprises an optical film located between each of the at least one optical functional layer and the end portion of each of the at least one optical fiber core, and a refractive index of the optical film is between a refractive index of a semiconductor film layer, close to the growth substrate, in the optical functional layer and a refractive index of the end portion.

2. The optical coupling structure according to claim 1, wherein a depth of each of the at least one first hole is greater than a length of the end portion of each of the at least one optical fiber core along the thickness direction of the growth substrate.

3. The optical coupling structure according to claim 1, wherein a depth of the second hole is greater than a length of the end portion of each of the at least one optical fiber core along the thickness direction of the growth substrate.

4. The optical coupling structure according to claim 1, wherein an inclined plane is provided on a side, close to the second hole, of each of the at least one first hole.

5. The optical coupling structure according to claim 1, further comprising an optical fiber, wherein the optical fiber comprises the at least one optical fiber core and the coating layer, the end portion of each of the at least one optical fiber core protrudes axially beyond the coating layer, the end portion is used for transmitting an optical signal to a corresponding optical functional layer, and the coating layer is correspondingly accommodated in the second hole.

6. The optical coupling structure according to claim 5, wherein the optical fiber is a multi-core optical fiber, the at least one optical fiber core comprises N optical fiber cores, the at least one optical functional layer comprises N optical functional layers, and N is an integer greater than or equal to 2.

7. The optical coupling structure according to claim 1, wherein a material of each of the at least one optical functional layer is a group III-V semiconductor material.

8. The optical coupling structure according to claim 1, wherein a material of the growth substrate is any one of Si, SiGe, SiC, sapphire, or a group III-V semiconductor material.

9. The optical coupling structure according to claim 1, wherein an aperture of each of the at least one first hole ranges from 5 μm to 20 μm, and/or an aperture of the second hole ranges from 100 μm to 10 mm.

10. The optical coupling structure according to claim 1, wherein the at least one optical functional layer comprises at least one of a light emitting functional layer or a photosensitive functional layer.

11. A method for manufacturing an optical coupling structure, comprising:

providing a growth substrate, and epitaxially forming at least one optical functional layer on a side of the growth substrate;

etching the growth substrate from the other side of the growth substrate and corresponding to a position of each of the at least one optical functional layer, to sequentially form a second hole and at least one first hole that are penetrating through the growth substrate, so that the at least one optical functional layer is located on a side, close to the at least one first hole, of the growth substrate, and an aperture of each of the at least one first hole being less than an aperture of the second hole, wherein the optical coupling structure further comprises an optical film located between each of the at least one optical functional layer and the end portion of each of the at least one optical fiber core, and a refractive index of the optical film is between a refractive index of a semiconductor film layer, close to the growth substrate, in the optical functional layer and a refractive index of the end portion.

12. The method according to claim 11, further comprising: providing an optical fiber, and the optical fiber comprising at least one optical fiber core and a coating layer wrapping the at least one optical fiber core;

removing the coating layer at an end of the at least one optical fiber core to obtain at least one end portion of the at least one optical fiber core; and inserting the optical fiber into the at least one first hole and the second hole, so that the at least one end portion of the at least one optical fiber core is correspondingly accommodated in the at least one first hole, and the coating layer is correspondingly accommodated in the second hole.

13. An optical communication system, comprising:

a transmitting apparatus having a transmitting end, and the transmitting end comprising a first optical coupling structure;

a receiving apparatus having a receiving end, and the receiving end comprising a second optical coupling structure; and an optical fiber, two ends of the optical fiber being connected to the first optical coupling structure and the second optical coupling structure, respectively, so as to transmit an optical signal between the transmitting apparatus and the receiving apparatus, and the optical fiber comprising at least one optical fiber core and a coating layer wrapping the at least one optical fiber core;

wherein the first optical coupling structure and the second optical coupling structure each comprise:

a growth substrate having at least one first hole and a second hole connected in series along a thickness direction of the growth substrate, the at least one first hole and the second hole penetrating through the growth substrate, and an aperture of each of the at least one first hole being less than an aperture of the second hole; and at least one optical functional layer located on a side, close to the at least one first hole, of the growth substrate;

in the first optical coupling structure, at least one first end portion of the at least one optical fiber core protrudes axially beyond the coating layer and is correspondingly accommodated in the at least one first hole, and the coating layer is correspondingly accommodated in the second hole; and/or in the second optical coupling structure, at least one second end portion of the at least one optical fiber core protrudes axially beyond the coating layer and is correspondingly accommodated in the at least one first hole, and the coating layer is correspondingly accommodated in the second hole.

14. The optical communication system according to claim 13, wherein along the thickness direction of the growth substrate, in the first optical coupling structure, a depth of each of the at least one first hole is greater than a length of the first end portion of a corresponding optical fiber core; and along the thickness direction of the growth substrate, in the second optical coupling structure, a depth of each of the at least one first hole is greater than a length of the second end portion of a corresponding optical fiber core.

15. The optical communication system according to claim 13, wherein along the thickness direction of the growth substrate, in the first optical coupling structure, a depth of the second hole is greater than a length of the first end portion of each of the at least one optical fiber core; and along the thickness direction of the growth substrate, in the second optical coupling structure, a depth of the second hole is greater than a length of the second end portion of each of the at least one optical fiber core.

16. The optical communication system according to claim 13, wherein in the first optical coupling structure and the second optical coupling structure, an inclined plane is provided on a side, close to the second hole, of each of the at least one first hole.

17. The optical communication system according to claim 13, wherein in the first optical coupling structure and the second optical coupling structure, the at least one optical fiber core comprises a plurality of optical fiber cores, and a number of the at least one optical fiber core is the same as a number of the at least one optical functional layer.

18. The optical communication system according to claim 13, wherein the first optical coupling structure and the second optical coupling structure each further comprise an optical film; in the first optical coupling structure, the optical film is located between each of the at least one optical functional layer and the first end portion of each of the at least one optical fiber core, and a refractive index of the optical film is between a refractive index of a semiconductor film layer, close to the growth substrate, in the optical functional layer and a refractive index of the first end portion; and in the second optical coupling structure, the optical film is located between each of the at least one optical functional layer and the second end portion of each of the at least one optical fiber core, and a refractive index of the optical film is between a refractive index of a semiconductor film layer, close to the growth substrate, in the optical functional layer and a refractive index of the second end portion.

19. The optical communication system according to claim 13, wherein the at least one optical functional layer of the first optical coupling structure comprises a light emitting functional layer, and the at least one optical functional layer of the second optical coupling structure comprises a photosensitive functional layer.

* * * * *